United States Patent
Okada et al.

[11] Patent Number: 5,410,622
[45] Date of Patent: Apr. 25, 1995

[54] OPTICAL INTEGRATED CIRCUIT HAVING LIGHT DETECTOR

[75] Inventors: Kuniaki Okada, Tenri; Kouji Minami, Gose; Renzaburo Miki; Hiroyuki Yamamoto, both of Tenri; Yoshio Yoshida, Nara; Yukio Kurata, Tenri, all of Japan

[73] Assignee: Sharp Kabushiki Kaisha, Osaka, Japan

[21] Appl. No.: 109,275

[22] Filed: Aug. 19, 1993

[30] Foreign Application Priority Data

Aug. 21, 1992 [JP] Japan .................. 4-222487

[51] Int. Cl.$^6$ .................................. G02B 6/12
[52] U.S. Cl. ......................... 385/14; 385/10; 385/37; 385/40
[58] Field of Search ............ 385/14, 10, 37, 40, 385/129–133, 143; 372/96; 257/432, 431, 436; 359/566

[56] References Cited

U.S. PATENT DOCUMENTS

| | | | |
|---|---|---|---|
| 4,674,100 | 6/1987 | Kobayashi | 372/96 |
| 4,942,366 | 7/1990 | Toda | 359/566 X |
| 5,070,488 | 12/1991 | Fukushima et al. | 385/14 X |
| 5,193,130 | 3/1993 | Nishiwaki et al. | 385/14 |

FOREIGN PATENT DOCUMENTS

| | | |
|---|---|---|
| 0386797 | 9/1990 | European Pat. Off. . |
| 60-189712 | 9/1985 | Japan . |
| 62-86307 | 4/1987 | Japan .................. 385/31 |
| 63-114288 | 5/1988 | Japan . |
| 2-87581 | 3/1990 | Japan . |
| 5188228 | 7/1993 | Japan .................. 385/14 |
| 2197122 | 5/1988 | United Kingdom . |

*Primary Examiner*—Rodney B. Bovernick
*Assistant Examiner*—Phan Thi Heartney Palmer
*Attorney, Agent, or Firm*—Morrison & Foerster

[57] ABSTRACT

An optical integrated circuit is disclosed. The optical integrated circuit includes: a dielectric waveguide having at least a waveguide layer for transmitting light in a first direction; a first reflector for reflecting the light in a substantially opposite direction to the first direction, the first reflector being formed on an end face of the waveguide layer; a grating coupler having a grating for diffracting at least a part of the light in a second direction which is different from the first direction, the grating coupler being formed at a surface of the waveguide layer; and a light detector for detecting the diffracted light, the light detector being optically connected with the dielectric waveguide.

8 Claims, 3 Drawing Sheets

OPTICAL INTEGRATED CIRCUIT HAVING LIGHT DETECTOR

BACKGROUND OF THE INVENTION

1. Field of the Invention

The present invention relates to an optical integrated circuit applied to an optical data processor such as an optical computer.

2. Description of the Related Art

Recently, it becomes more important to transmit and process informational data. Especially, data transmission and data processing using light are thought as an important technology because light can travel fast. An optical integrated circuit is a kind of device which processes information consisting of light. The optical integrated circuit can be made small by employing optical waveguides. Such optical integrated circuits can be produced on a large scale by utilizing semiconductor manufacturing processes, that enable production of the optical integrated circuits at low cost.

Light signals are processed in such an optical integrated circuit, and are finally converted into electric signals. Referring to FIG. 5, a light detector of a conventional optical integrated circuit is illustrated. FIG. 5 schematically shows a cross sectional view of an optical integrated circuit 39 having a light detector 38. A p-type region 32 doped with p-type impurities is formed in a surface region of an n-type silicon substrate 31. The p-type region 32 and the n-type silicon substrate 31 form a pn conjunction. An electrode 33 and an electrode 34 are respectively connected with the p-type region 32 and the
n-type silicon substrate 31. The light detector 38 consists of a part of the n-type silicon substrate 31, the p-type region 32, the electrode 33 and the electrode 34. A buffer layer 35 is formed on the n-type silicon substrate 31. An optical waveguide 36 is formed on the buffer layer 35 and the p-type region 32, and the optical waveguide 36 is directly in contact with the p-type region 32.

Light 37 travels in the optical waveguide 36. When the light 37 reaches above the p-type region 32, a part of the light 37 is absorbed by the p-type region 32. The light absorbed by the p-type region 32 is converted into electric signals, and the electric signals are detected through the electrode 33 and the electrode 34.

In the optical integrated circuit 39 having the light detector 38, light sensitivity of the light detector 38 depends on the length 1 of the p-type region 32. The length 1 must be long enough to receive much of the light 37 so that the light detector 38 has the sufficient light sensitivity for practical use, for example, to obtain a sufficient signal. However, as length 1 is elongated, the light detector 38 is more influenced by stray light in the optical integrated circuit 39. Such stray light degrades a signal-to-noise ratio of the light detector 38.

The present invention overcomes the above mentioned shortcomings associated with the conventional optical integrated circuit and provides an optical integrated circuit having a light detector with high sensitivity and good signal-to-noise ratio.

SUMMARY OF THE INVENTION

The optical integrated circuit of this invention includes: a dielectric waveguide having at least a waveguide layer for transmitting light in a first direction; a first reflector for reflecting the light in a substantially opposite direction to the first direction, the first reflector being formed on an end face of the waveguide layer; a grating coupler having a grating for diffracting at least a part of the light in a second direction which is different from the first direction, the grating coupler being formed at a surface of the waveguide layer; and a light detector for detecting the diffracted light, the light detector being optically connected with the dielectric waveguide.

According to an optical integrated circuit of the present invention, light which is not diffracted by a grating coupler is reflected by a first reflector and reaches the grating coupler again. Therefore, most of the light irradiates a light detector effectively.

Thus, the invention described herein makes possible the advantage of providing an optical integrated circuit having light detectors with high sensitivity and good signal-to-noise ratio.

This and other advantages of the present invention will become apparent to those skilled in the art upon reading and understanding the following detailed description with reference to the accompanying figures.

DESCRIPTION OF THE PREFERRED EMBODIMENTS Example 1

Figure 1:
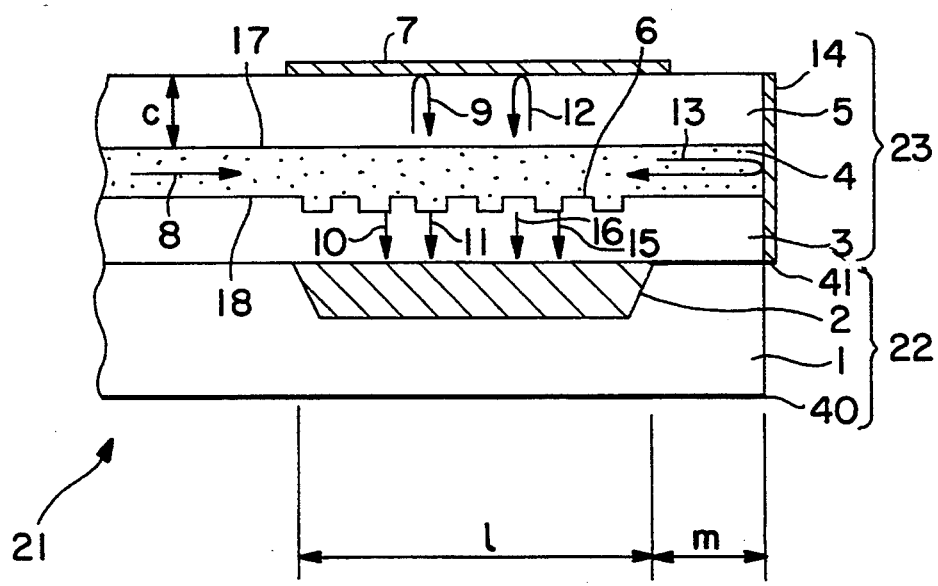
FIG. 1 is a schematic cross sectional view of an optical integrated circuit of the present invention in Example 1.

FIG. 1 schematically shows a cross sectional view of an optical integrated circuit 21 of the present invention. A p-type region 2 doped with p-type impurities is formed in a surface region of an n-type silicon substrate 1. The n-type silicon substrate 1 and the p-type region 2 are respectively connected with electrodes 40 and 41, for example, shown for convenience only as bold lines in FIG. 1. A light detector 22 consists of the p-type region 2, a part of the n-type silicon substrate 1 and the electrodes 40 and 41. The p-type region 2 and the n-type silicon substrate 1 form a pn junction for detecting light. The light penetrates in the p-type region 2 and is converted into an electric signal. The electric signal is detected via the electrodes 40 and 41.

A lower cladding layer 3 made of silicon dioxide is formed on the n-type silicon substrate 1. A waveguide layer 4 made of silicon dioxide is formed on the lower cladding layer 3, and an upper cladding layer 5 made of silicon dioxide is formed on the waveguide layer 4. A dielectric slab waveguide 23 consists of the lower cladding layer 3, the waveguide layer 4, and the upper cladding layer 5. In this example, the dielectric slab waveguide 23 is used as a dielectric waveguide. The waveguide layer 4 transmits light 8 in a first direction. A grating coupler 6 is formed at a part of a lower surface 18 of the waveguide layer 4. The grating coupler 6 is positioned above the p-type region 2 so that lights 10, 11, 15, and 16 which are diffracted in a second direction by the grating coupler 6 can irradiate the p-type region 2.

A first reflector 14 is formed on an end face of the dielectric slab waveguide 23. As is shown in FIG. 1, light 13 traveling in the first direction is reflected by the first reflector 14 and travels in an opposite direction from the first direction. A second reflector 7 is formed on the upper cladding layer 5. The second reflector 7 is positioned so that lights 9 and 12, which are diffracted in an opposite direction from the second direction by the grating coupler 6, can be reflected in the second direction.

When the light 8 traveling in the waveguide layer 4 reaches above the grating coupler 6, a part of the light 8 is diffracted by the grating coupler 6 and is divided into the lights 9 and 10. The light 9 is diffracted toward the upper cladding layer 5 and the light 10 is diffracted toward the lower cladding layer 3. The other part of the light 8, which is not diffracted by the grating coupler 6, becomes the light 3. The light 10 passes the lower cladding layer 3 and irradiates the p-type region 2. The light 9 is reflected by the second reflector 7 and reaches the grating coupler 6 again. A part of the light 9 passes the grating coupler 6 without being diffracted and becomes the light 11. The other part of the light 9 is diffracted by the grating coupler 6 and is added to the light 13. The light 11 passes the lower cladding layer 3 and irradiates the p-type region 2.

The light 13 is reflected by the first reflector 14 and reaches the grating coupler 6 again. The light 13 is divided into the lights 12 and 15. The light 15 passes the lower cladding layer 3 and irradiates the p-type region 2. The light 12 is reflected by the second reflector 7. A part of the light 12 passes the grating coupler 6 without being diffracted and becomes the light 16. The light 16 irradiates the p-type region 2.

Figure 2:
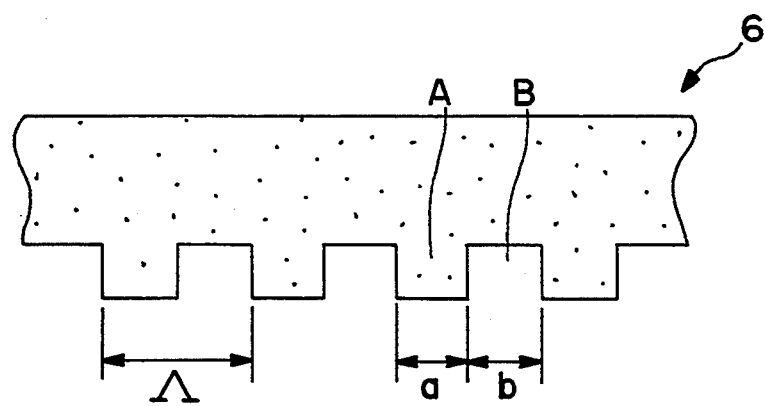
FIG. 2 is an enlarged sectional view of a grating coupler in the optical integrated circuit shown in FIG. 1.

FIG. 2 shows an enlarged cross sectional view of the grating coupler 6. The grating coupler 6 has a grating which consists of a plurality of ridges A and a plurality of grooves B. In order that the grating coupler 6 diffracts the lights 8 and 13 in a substantially perpendicular direction to the lights 8 and 13, it is preferable that; a period Λ of the grating substantially satisfies the following Equation (1).

$$\Lambda = \frac{\lambda}{N} \quad (1)$$

Where, $\lambda$ is the free-space wavelength of the light which travels the dielectric slab waveguide 23, and N is the effective refractive index of the dielectric slab waveguide 23. Moreover, it is further preferable that the cross sections of ridge A and groove B are rectangular and that the cross sectional width a of the ridge A and the cross sectional width b of the groove B are set to be same, as is shown in FIG. 2. Such a grating profile prevents second order diffraction light from being generated at the grating coupler 6. Thus, the light 8 and 13 can be diffracted in the perpendicular direction and irradiate the p-type region 2 effectively. Moreover a thickness c of the upper cladding layer 5 is preferably selected so that the lights 10 and 11 have the same phase.

As is mentioned above, the light 13, which is not diffracted by grating coupler 6, is reflected by the first reflector 14 and reaches the grating coupler 6 again to be directed into the p-type region 2 of the light detector 22. Therefore, most of the light 8 irradiates the p-type region 2 of the light detector 22 effectively. The lights 9 and 12, which are diffracted in the opposite direction to the p-type region 2, are reflected by the second reflector 7 and irradiate the p-type region 2 of the light detector 22.

The optical integrated circuit 21 shown in FIG. 1 has the grating coupler 6 at the lower surface 18 of the waveguide layer 4. However, the grating coupler 6 may be formed at an upper surface 17 of the waveguide layer 4. At whichever surface the grating coupler 6 is formed, the light 8 can be diffracted. Diffraction efficiency of the grating coupler 6 is different in accordance with the aforementioned positions of the grating coupler 6. Also, the diffraction efficiency depends on the structure and materials of the dielectric slab waveguide 23. Therefore, it is preferable that the grating coupler 6 is formed at either the upper surface 17 or the lower surface 18 which will have the higher diffraction efficiency.

Figure 5:
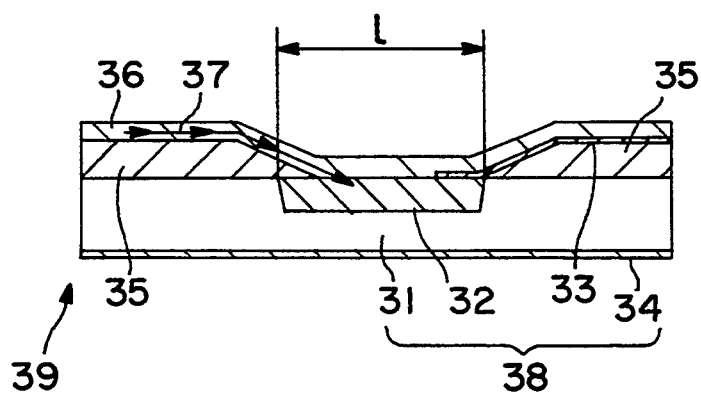
FIG. 5 is a schematic cross sectional view of an optical integrated circuit according to a conventional technique.

FIG. 1 shows that the light detector 22 is formed near the first reflector 14. However, it is also possible for the light detector 22 to be positioned relatively farther from the first reflector 14 formed on the end face of the dielectric slab waveguide 23. If the first reflector 14 is formed on the end face of the dielectric slab waveguide 23, the light which is not diffracted by the grating coupler 6 (i.e., the light 13) can be reflected by the first reflector 14 and travel above the grating coupler 6 again. The reflected light can also irradiate the p-type region 2 and increase the amount of the light which irradiates the light detector 22. Therefore, relative to prior light detectors, such as that shown in FIG. 5, the light detector 22 of the invention can have improved sensitivity and signal-to-noise ratio without enlarging the length 1 of the p-type region 2.

For the reason mentioned above, as is shown in FIG. 1, a distance m between the light detector 22 and the first reflector 14 can be selected in accordance with a structure of a device to which the present invention is applied. However, in the case where the attenuation of the light in the dielectric slab waveguide 23 may not be neglected, the distance m is preferably set to be in the range where the light reflected by the first reflector 14 is not significantly attenuated.

Hereinafter, a method for producing the optical integrated circuit 21 will be described. The optical integrated circuit 21 propagates the light having a free-space wavelength equal to 780 nm by $TE_0$ single mode.

Figure 3A:
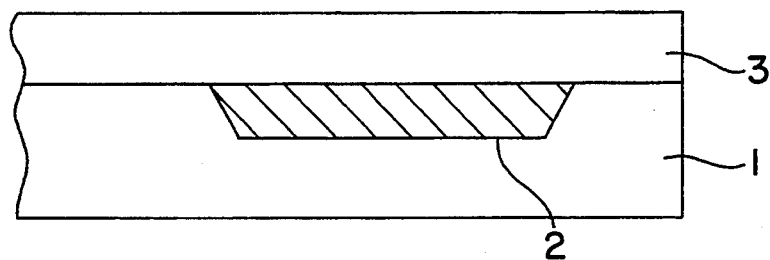
FIGS. 3A through 3C are schematic cross sectional views for illustrating a method for producing the optical integrated circuit shown in FIG. 1.
Figure 3B:
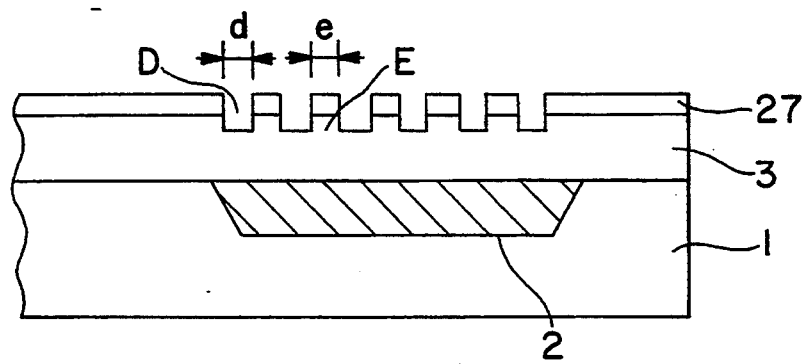

As is shown in FIG. 3A, p-type impurities are doped in an n-type silicon substrate 1, and a p-type region 2 is formed in a surface region of the n-type silicon substrate 1. A lower cladding layer 3 (thickness: 2200 nm) is formed on the n-type silicon substrate 1 by a sputtering method. The lower cladding layer 3 is made of silicon dioxide and has a refractive index equal to 1.45. After an electron beam sensitive resist is coated over the n-type silicon substrate 1 by a spin coat method, a resist pattern 27 having a grating pattern is formed by using electron beam (FIG. 3B). A dielectric slab waveguide 23 which will be formed later is designed so as to have an effective refractive index N equal to 1.506. According to the Equation (1), a grating period Λ is calculated at 518 nm. Thus, widths d and e are set to be 259 nm respectively.

Figure 3C:
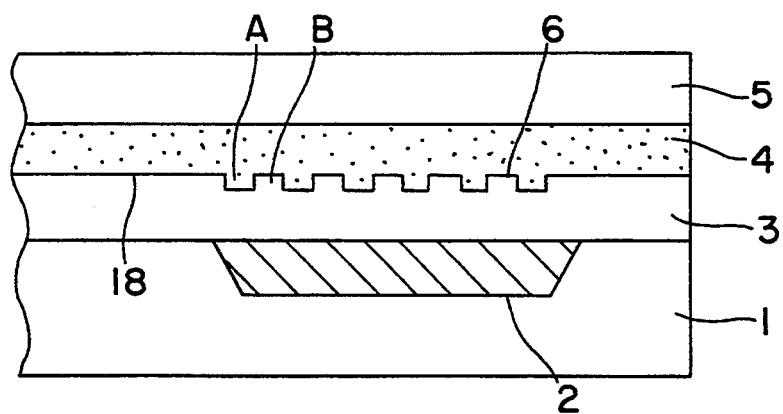

As is shown in FIG. 3B, the lower cladding layer 3 is etched by 50 nm depth using the resist pattern 27 as a mask. By using an anisotropic etching method such as a dry etching, grooves D and ridges E having rectangular cross sections are formed. After the resist pattern 27 is removed, a waveguide layer 4 (thickness: 700 nm, refractive index: 1.54) is formed on the lower cladding layer 3, as is shown in FIG. 3C. The waveguide layer 4 is deposited by a sputtering method with a #7059 target which is commercially available from Corning Company. A grating coupler 6 is simultaneously formed at the lower surface 18 of the waveguide layer 4. The grating coupler 6 has a grating consisting of ridges A and grooves B in accordance with grooves D and the ridges E of the lower cladding layer 3. Thus, widths a and b shown in FIG. 2 are equal to 259 nm respectively. Then, an upper cladding layer 5 (thickness: 2200 nm) shown in FIG. 3C is formed on the waveguide layer 4 by a sputtering method. The upper cladding layer 5 is made of silicon dioxide and has a refractive index equal to 1.45. Whereby, the dielectric slab waveguide 23 consisting of the lower cladding layer 3, the waveguide layer 4, and the upper cladding layer 5 is formed.

Then, as is shown in FIG. 1, a first reflector 14 (thickness: 200 nm) made of an aluminum film is formed on an end face of the dielectric slab waveguide 23. A second reflector 7 (thickness: 200 nm) made of an aluminum film is formed on the upper cladding layer 5 so that the second reflector 7 is positioned above the grating coupler 6. The first reflector 14 and the second reflector 7 are formed by a vacuum evaporation method.

Example 2.

Figure 4:
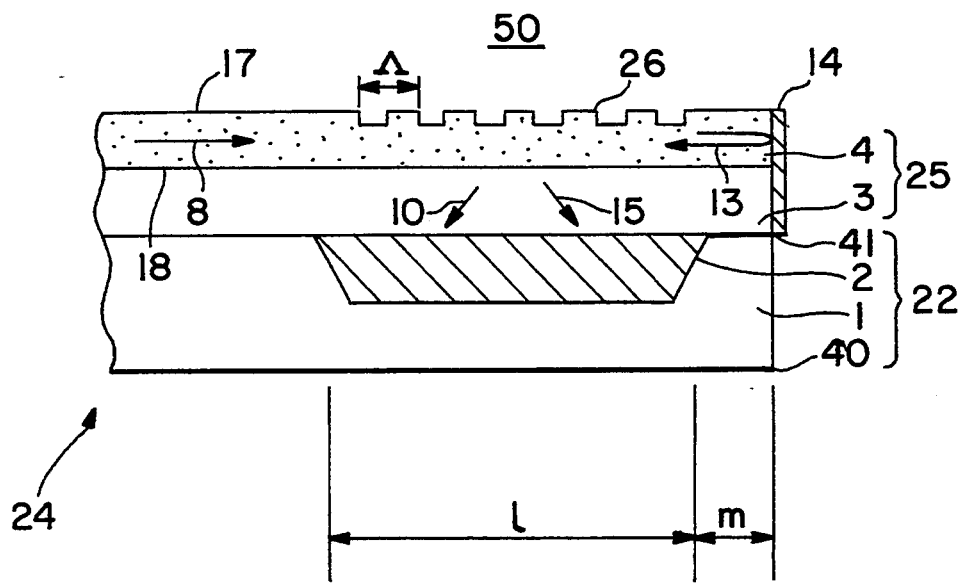
FIG. 4 is a schematic cross sectional view of an optical integrated circuit of the present invention in Example 2.

FIG. 4 schematically shows a cross sectional view of an optical integrated circuit 24 of the present invention. A p-type region 2 doped with p-type impurities is formed in a surface region of an n-type silicon substrate 1. The n-type silicon substrate 1 and the p-type region 2 are respectively connected with electrodes 40 and 41, for example, shown for convenience only as bold lines in FIG. 4. A light detector 22 consists of the p-type region 2, a part of the n-type silicon substrate 1, and the electrodes 40 and 41. The p-type region 2 and the n-type silicon substrate 1 form a pn junction for detecting light, and the light is converted into an electric signal. The electric signal is detected via the electrodes 40 and 41.

A lower cladding layer 3 made of silicon dioxide is formed on the n-type silicon substrate 1. A waveguide layer 4 made of silicon dioxide is formed on the lower cladding layer 3. An upper cladding layer is not formed on the waveguide layer 4 in this example. However, an upper surface 17 of the waveguide layer 4 is in contact with air 50. The air 50 functions as an upper cladding layer because the air 50 has lower refractive index than the waveguide layer 4. A dielectric slab waveguide 25 consists of the waveguide layer 4 and the lower cladding layer 3. In this example, the dielectric slab waveguide 25 is used as a dielectric waveguide. The waveguide layer 4 transmits light 8 in a first direction. A grating coupler 26 is formed at a part of the upper surface 17 of the waveguide layer 4. The grating coupler 26 is positioned above the p-type region 2 so that lights 10 and 15 which are diffracted in a second direction by the grating coupler 26 can irradiate the p-type region 2.

A first reflector 14 is formed at an end face of the dielectric slab waveguide 25. As is shown in FIG. 4, light 13 traveling in the first direction is reflected at the first reflector 14 and travels in an opposite direction from the first direction.

The grating coupler 26 has a grating with a period Λ. The period Λ substantially satisfies the following Inequality (2).

$$\frac{1}{\lambda} < \frac{1}{\Lambda} - \frac{N}{\lambda} < n_s \frac{1}{\lambda} \qquad (2)$$

Where, $\lambda$ is the free-space wavelength of the light which travels the dielectric slab waveguide 25, N is the effective refractive index of the dielectric slab waveguide 25, and $n_s$ is the refractive index of the lower cladding layer 3 which is contact with the waveguide layer 4.

In the case where the period Λ of the grating coupler 26 satisfies the Inequality (2), a diffraction toward the air does not satisfy a phase matching condition, and light is diffracted only toward the lower cladding layer 3 without generating second order diffraction light. Therefore, when the light 8 reaches the grating coupler 26, a part of the light 8 is diffracted only toward the lower cladding layer 3 by the grating coupler 26 and becomes light 10. The light 10 passes through the lower cladding layer 3 and irradiates the p-type region 2. Light 13, which is not diffracted by the grating coupler 26, is reflected by the first reflector 14 and reaches the grating coupler 26 again. The light 13 is diffracted toward the lower cladding layer 3 by the grating coupler 26 and becomes light 15. The light 15 passes through the lower cladding layer 3 and irradiates the p-type region 2.

As is mentioned above, by forming the grating coupler 26 which satisfies the Inequality (2), the light 8 is diffracted only toward the lower cladding layer 3. Moreover, the light 13, which is not diffracted by the grating coupler 26, can be reflected by the first reflector 14 and reaches the grating coupler 26 again. Therefore, most of the light 8 irradiates the p-type region 2 of the light detector 22 effectively.

The optical integrated circuit 24 is produced by the same method as is mentioned in Example 1. The lower cladding layer 3 is made of silicon dioxide and the waveguide layer 4 is formed by a sputtering method with a #7059 target which is available from Corning Company. Each layer has the same thickness and refractive index as is explained in Example 1. The dielectric slab waveguide 25 has an effective refractive index equal to 1.496. In order to determine a grating period Λ of the grating coupler 26, by using the values of the refractive index (1.45) of the lower cladding layer 3, the effective refractive index (1.496) of the dielectric slab waveguide 25, and the free-space wavelength (780 nm) in the Inequality (2) the following inequality is obtained.

264 (nm) < Λ < 312 (nm)

Thus, the grating period Λ of the grating coupler 26 is set to be 300 nm.

The optical integrated circuit 24 shown in FIG. 4 has the grating coupler 26 at the upper surface 17 of the waveguide layer 4. However, the grating coupler 26 may be formed at an lower surface 18 of the waveguide layer 4. At whichever surface the grating coupler 26 is formed, the light 8 can be diffracted. A diffraction efficiency of the grating coupler 26 is different in accordance with an aforementioned position of the grating coupler 26. Also, the diffraction efficiency depends on the structure and materials of the dielectric slab waveguide 25. Therefore, it is preferable that the grating coupler 26 is formed at either the upper surface 17 or the lower surface which will have the higher diffraction efficiency.

FIG. 4 shows that the light detector 22 is formed near the first reflector 14. However, it also is possible for the light detector 22 to be positioned relatively farther from the first reflector 14 formed on the end face of the dielectric slab waveguide 25. If the first reflector 14 is formed on the end face of the dielectric slab waveguide 25, the light which is not diffracted by the grating coupler 26 (i.e., the light 13) can be reflected by the first reflector 14 and travel above the grating coupler 26 again. Such a reflected light can also irradiate the p-type region 2 and increase the amount of the light which irradiates the light detector 22. Therefore, relative to prior light detectors, such as that shown in FIG. 5, the light detector 22 of the present invention can have improved sensitivity and signal-to-noise ratio without enlarging the length 1 of the p-type region 2.

For the reason mentioned above, a distance m between the light detector 22 and the first reflector 14 can be selected in accordance with a structure of a device to which the present invention is applied. However, in the case where the attenuation of the light in the dielectric slab waveguide 25 may not be neglected, the distance m is preferably set to be in the range which the light reflected by the first reflector 14 is not significantly attenuated.

In the Examples 1 and 2, the light detector using a silicon pn junction, a dielectric slab waveguide guide made of silicon dioxide, and first and second reflectors made of aluminum are utilized. However, it is obvious to those skilled in the art that aforementioned components can be modified according to the wavelength of the light traveling in the optical integrated circuit. For example, a light detector made of indium gallium arsenide is suitable for detecting light having the wavelength equal to 1.4 μm. A dielectric slab waveguide is used as a dielectric waveguide, however, the dielectric waveguide may be formed in a strip shape or in other shapes. Also, another metal film such as a titanium film or a dielectric multilayer film, such as a multilayer made of silicon dioxide and titanium dioxide, can be utilized as a first or second reflector.

In the Example 1, the grating coupler 6 juts out from the waveguide layer 4, however, the grating coupler 6 may formed in hollows as is shown in FIG. 4. Also, in the Example 2, the grating coupler 26 may Jut out from the waveguide layer 4 as is show in FIG. 1.

Some exemplary values for indices of refraction and other dimensions are mentioned above. It will be appreciated that other values which will enable operation of the invention described may be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical integrated circuit comprising:
   a dielectric waveguide having at least a waveguide layer for transmitting light in a first direction, said light having a free-space wavelength λ;
   a first reflector for reflecting said light in a substantially opposite direction to said first direction, said first reflector being formed on an end face of said waveguide layer;
   a grating coupler having a grating for diffracting at least a part of said light in a second direction which is different from said first direction, said grating coupler being formed at a surface of said waveguide layer;
   at least one light detector for detecting said diffracted light, each of said at least one light detector being optically connected with said dielectric waveguide, and
   a second reflector for reflecting said light toward said at least one light detector, said second reflector being formed above said grating coupler;
   wherein a period of said grating satisfies a following equation:

$$\Lambda = \frac{\lambda}{N}$$

where $\Lambda$ is said of period said grating, and
N is an effective refractive index of said dielectric waveguide.

2. An optical integrated circuit according to claim 1, wherein said grating comprises plurality of ridges and grooves, each of said ridges and grooves having a rectangular cross section and having substantially the same width along with said first direction.

3. An optical integrated circuit according to claim 1, wherein said grating coupler and all of said light detectors have substantially the same length along said first direction, and wherein said grating coupler is provided right above said at least one light detector.

4. An optical integrated circuit according to claim 3, wherein said optical integrated circuit has only one such light detector.

5. An optical integrated circuit comprising:
   a dielectric waveguide having at least a waveguide layer for transmitting light in a first direction, said light having a free-space wavelength λ;
   a first reflector for reflecting said light in a substantially opposite direction to said first direction, said first reflector being formed on an end face of said waveguide layer;
   a grating coupler having a grating for diffracting at least a part of said light in a second direction which is different from said first direction, said grating coupler being formed at a surface of said waveguide layer; and
   at least one light detector for detecting said diffracted light, each of said at least one light detector being optically connected with said dielectric waveguide,
   wherein said dielectric waveguide further has a cladding layer, said waveguide layer being formed on said cladding layer, a period of said grating satisfying a following inequality:

$$\frac{1}{\lambda} < \frac{1}{\Lambda} - \frac{N}{\lambda} < \eta_s \frac{1}{\lambda}$$

where $\Lambda$ is said period of said grating,
N is an effective refractive index of said dielectric waveguide, and
$\eta_s$ is a refractive index of said cladding layer.

6. An optical integrated circuit according to claim 5, wherein said grating comprises a plurality of ridges and grooves, each of said ridges and grooves having a rectangular cross section and having substantially the same width along said first direction.

7. An optical integrated-circuit according to claim 5, wherein said grating coupler has a shorter length along the said first direction than all of said at least one light detector, and is provided right above said light detectors.

8. An optical integrated circuit according to claim 7, wherein said optical integrated circuit has only one such light detector.

* * * * *